(12) United States Patent
Wu et al.

(10) Patent No.: US 6,781,222 B2
(45) Date of Patent: Aug. 24, 2004

(54) SEMICONDUCTOR PACKAGE HAVING VERTICALLY MOUNTED PASSIVE DEVICES UNDER A CHIP AND A FABRICATING METHOD THEREOF

(75) Inventors: Chi Chuan Wu, Taichung (TW); Chian Ping Huang, Hsinchu (TW); Jui-Yu Chuang, Taichung (TW); Ho-Yi Tsai, Chiayi (TW); Yude Chu, Taichung (TW)

(73) Assignee: Siliconware Precision Industries Co., Ltd., Taiwan (TW)

( * ) Notice: Subject to any disclaimer, the term of this patent is extended or adjusted under 35 U.S.C. 154(b) by 0 days.

(21) Appl. No.: 09/932,053

(22) Filed: Aug. 18, 2001

(65) Prior Publication Data

US 2002/0086500 A1 Jul. 4, 2002

(30) Foreign Application Priority Data

Dec. 30, 2000 (TW) .......................... 89128443 A

(51) Int. Cl.$^7$ .............................................. H01L 23/06
(52) U.S. Cl. ................. 257/684; 257/687; 257/690; 257/787; 438/107; 438/108; 438/124; 438/455; 438/614; 438/617
(58) Field of Search ................ 438/107, 108, 438/124, 455, 614, 617, 127; 257/684, 687, 690, 787

(56) References Cited

U.S. PATENT DOCUMENTS

| | | | | |
|---|---|---|---|---|
| 5,249,354 A | * | 10/1993 | Richman et al. | 29/827 |
| 5,355,283 A | * | 10/1994 | Marrs et al. | 361/760 |
| 5,847,445 A | | 12/1998 | Wark et al. | |
| 6,022,583 A | * | 2/2000 | Falcone et al. | 427/96 |

* cited by examiner

*Primary Examiner*—Hsien Ming Lee
(74) *Attorney, Agent, or Firm*—Peter F. Corless; Steven M. Jensen; Edwards & Angell, LLP

(57) ABSTRACT

A semiconductor package and its fabricating method are proposed, in which a plurality of passive devices are integrated under a semiconductor chip, so as to increase the layout number of the passive devices in the semiconductor package and enhance the flexibility of substrate routability, as well as reduce an occupied area of a substrate for miniaturize the semiconductor package in profile. Moreover, as the integrated passive devices are further encapsulated by using an insulative material prior to a molding process, the dislocation of the passive devices caused by a high temperature and mold flow of a molding resin can be prevented from occurrence during molding. Furthermore, the encapsulated passive devices are prevented from contacting bonding wires, allowing the occurrence of short circuit to be avoided and quality of the packaged product to be assured.

20 Claims, 5 Drawing Sheets ized in profile. Moreover,

SEMICONDUCTOR PACKAGE HAVING VERTICALLY MOUNTED PASSIVE DEVICES UNDER A CHIP AND A FABRICATING METHOD THEREOF

FIELD OF THE INVENTION

The present invention relates to semiconductor packages and fabricating methods thereof, and more particularly, to a semiconductor package having passive devices and a fabricating method thereof.

BACKGROUND OF THE INVENTION

A conventional ball grid array (BGA) semiconductor package has a plurality of solder balls implanted on a bottom surface of a substrate in an array arrangement as connectors sufficient in number for the need of the semiconductor chip with high integration encapsulated in the semiconductor package. As such a BGA semiconductor package is suitable for the use of a semiconductor chip which contains more electronic components or passive devices such as capacitors, resistors or inductors, the BGA semiconductor package becomes the mainstream for packaged products.

Passive devices, such as capacitors, resistors or inductors, can be operatively associated with semiconductor packages, for example, a high-frequency semiconductor package. For BGA semiconductor packages, the passive devices are typically disposed at corners of the substrate on which a semiconductor chip is mounted or on an additional layout area of the substrate excluding a chip-mounting region (as shown in FIG. 1) so as to prevent the passive devices from affecting the electrical connection between the semiconductor chip and a plurality of bonding fingers formed on the substrate. However, the foregoing arrangement for the passive devices generates several problems. First, the requirement for the passive devices to be disposed at predetermined positions on the substrate restricts the flexibility of substrate routability. Moreover, the layout number of the passive devices is limited by formation positions of the bonding fingers, which is disadvantageous for a highly integrated semiconductor chip. In addition, in the case of more passive devices being required with increase in the performance for the semiconductor package, the substrate surface needs to simultaneously adopt more semiconductor chips and more passive devices, thereby making the semiconductor package undesirably enlarged in profile.

According to the above problems, it is considered to integrate the passive devices at a region of the substrate between the semiconductor chip and a wire bonding area. However, with increase in density of the electronic components and electric circuits formed on the semiconductor chip, more bonding wires are also required; further, as the passive device is generally larger in height (0.8 mm) than that of the semiconductor chip (0.55 mm), in order to avoid the contact between the bonding wire and the passive device for preventing short circuit from occurrence, the bonding wire needs to be elongated upwardly for crossing over the passive device, as shown in FIG. 2. This not only enhances the bonding difficulty but also increases the length of wire loop. Additionally, if the elongated bonding wire is not firmly supported, it will sag down due to gravity to contact the passive device thereby resulting in the short circuit This can be solved by U.S. Pat. No. 5,847,445 disclosing an insulative dam disposed on the substrate and the semiconductor chip for supporting the elongated bonding wire. However, this method not only makes the fabricating process more complex, but also raises the fabricating cost due to an increased amount of gold or aluminum for making the elongated bonding wires.

Furthermore, as the passive devices are attached to the predetermined positions of the substrate through a solder paste by means of conventional surface-mount technology (SMT), problems may be generated during a molding process. For example, as a molten resin is injected at a high temperature (175° C.) close to the melting temperature of the solder paste (183° C.) used for the attachment of the passive devices, the solder paste then becomes semi-melted, making the passive devices possibly dislocated from the predetermined positions due to a stress from the mold flow of the molten resin, so that the quality of conductivity is degraded and the short circuit can be induced.

SUMMARY OF THE INVENTION

A primary objective of the present invention is to provide a semiconductor package and a fabricating method thereof in which a plurality of passive devices are integrated under a semiconductor chip, so as to increase the layout number of the passive devices in the semiconductor package and enhance the flexibility of substrate routability, as well as reduce an occupied area of a substrate for miniaturize the semiconductor package in profile. Moreover, the invention has the passive devices integrated under the chip for preventing the dislocation of the passive devices caused by a high temperature and mold flow from occurrence. Furthermore, the invention having the integrated passive devices allows the wire bonding difficulty to be reduced, and the direct contact between bonding wires and the passive devices to be avoided, so as to prevent short circuit from occurrence and save the fabricating cost.

According to the above and other objectives, the invention provides a novel semiconductor package and a fabricating method thereof. The semiconductor package includes: a substrate having a device-mounting region predefined within a chip-mounting region thereon for forming a plurality of solder pads thereon, and a wire bonding region predefined around the device-mounting region for forming a plurality of bonding fingers thereon; a plurality of passive devices (such as capacitors, resistors or inductors) correspondingly attached to the solder pads of the device-mounting region by means of a solder paste, for electrically connecting the passive devices to the substrate; an insulative material for encapsulating the passive devices and part of the substrate; a semiconductor chip having an active surface for forming a plurality of electrical circuits and bonding pads thereon, and an inactive surface directly or indirectly attached to a surface of the insulative material above the passive devices; a plurality of gold wires for electrically connecting the semiconductor chip to the substrate; an encapsulant for encapsulating the semiconductor chip and the gold wires; and a plurality of array-arranged conductive members electrically connected to a bottom surface of the substrate.

The invention is characterized in that the passive devices are vertically integrated under the semiconductor chip without occupying the surface area of the substrate so as to miniaturize the semiconductor package in profile. Moreover, prior to a wire bonding process, the passive devices are encapsulated by the insulative material, effectively allowing restrictions on positioning the bonding pads and the passive devices to be avoided, so as to remarkably improve the flexibility of substrate routability.

On the other hand, the passive devices are attached to the solder pads of the substrate through a solder paste with the use of surface-mount technology (SMT) and are hermetically encapsulated by the insulative material prior to a molding process, so that the dislocation of the passive devices caused by a high temperature and mold flow of a molding resin can be prevented from occurrence. Furthermore, as the encapsulated passive devices is free of direct contact with the semiconductor chip or the bonding wires, the occurrence of short circuit can be avoided and the quality of the packaged product is improved.

BRIEF DESCRIPTION OF THE DRAWINGS

The present invention may best be more fully understood through the following description with reference to the accompanying drawings, in which.

DETAILED DESCRIPTION OF THE PREFERRED EMBODIMENT

Figure 1:
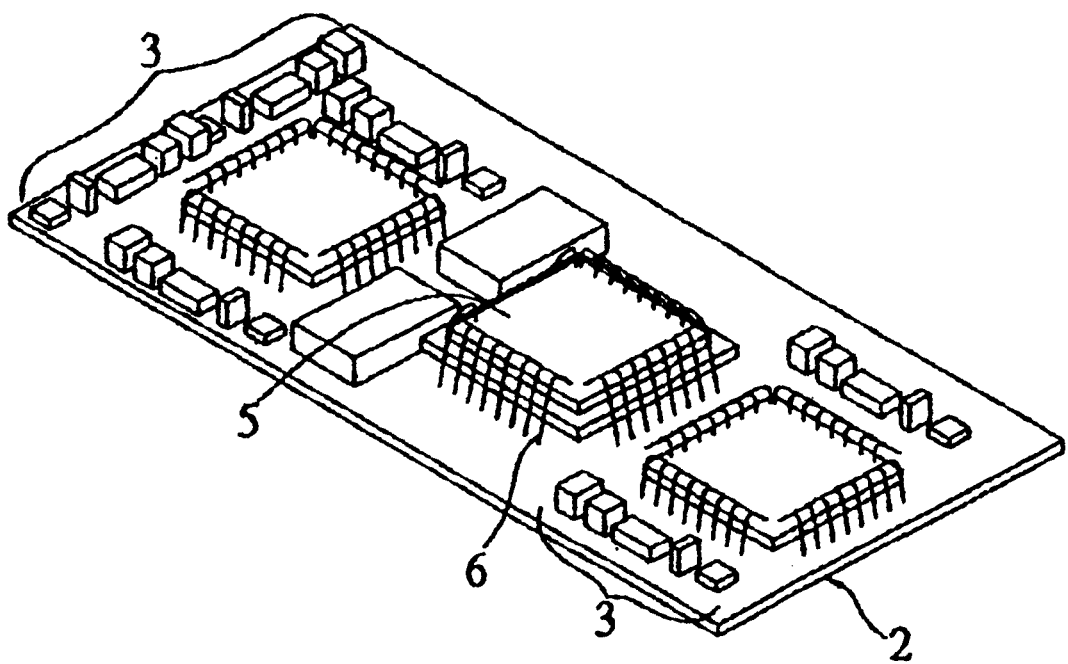
FIG. 1 (PRIOR ART) is a top view showing the arrangement of devices in a conventional semiconductor package.
Figure 2:
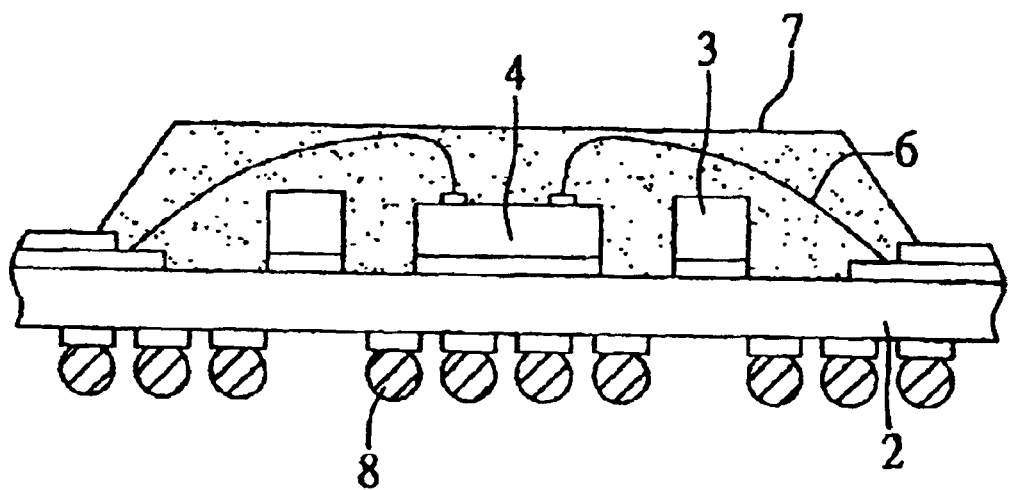
FIG. 2 (PRIOR ART) is a sectional view of a conventional BGA semiconductor package having a plurality of passive devices.
Figure 3:
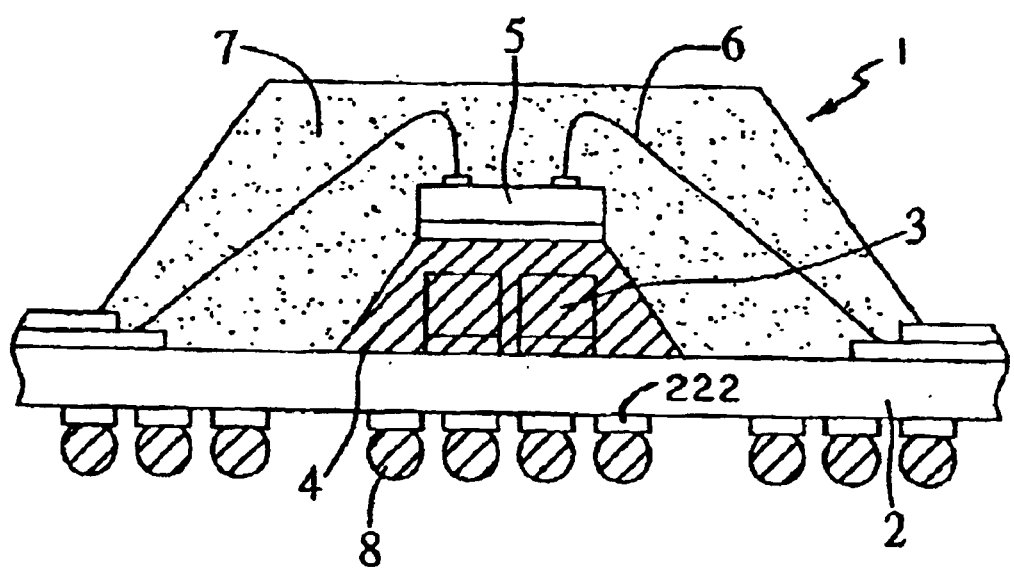
FIG. 3 is a sectional view of the semiconductor package of the invention.

As illustrated in FIG. 3, the semiconductor package 1 of the present invention includes a substrate 2; a plurality of passive devices 3 attached to the substrate 2; an insulative material 4 for completely encapsulating the passive devices 3; a semiconductor chip 5 disposed on a surface of the insulative material 4; a plurality of gold wires 6 for electrically connecting the chip 5 to the substrate 2, an encapsulant 7 for encapsulating the chip 5 and the gold wires 6; and a plurality of solder bumps 8 for electrically connecting the substrate 2 to an external device.

Figure 4A:
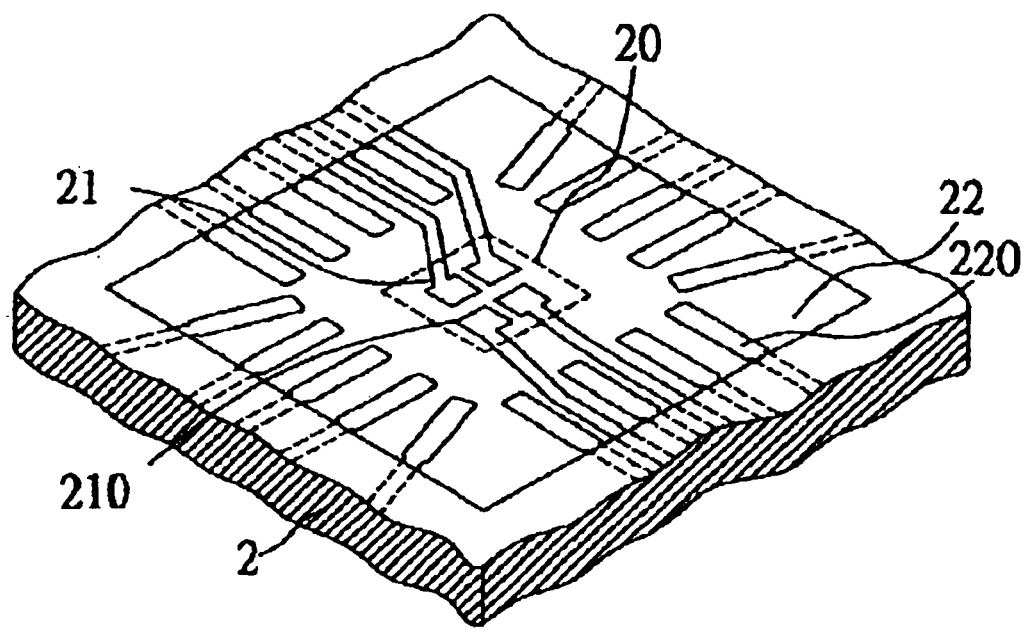
FIGS. 4A–4E are schematic diagrams showing the steps involved in the fabricating method of the semiconductor package of the invention.

Illustrated in FIGS. 4A–4E are the steps involved in the fabricating method of the semiconductor package 1 of the invention. Referring first to FIG. 4A, the substrate 2 is provided with a device-mounting region 21 predefined within a chip-mounting region 20 and with a wire bonding region 22 predefined around the device-mounting region 21 on the substrate 2. On the device-mounting region 21 there are formed a plurality of solder pads 210, while on the wire bonding region 22 there are formed a plurality of bonding fingers 220 for electrically connecting the semiconductor chip 5 to the wire bonding region 22.

Figure 4B:
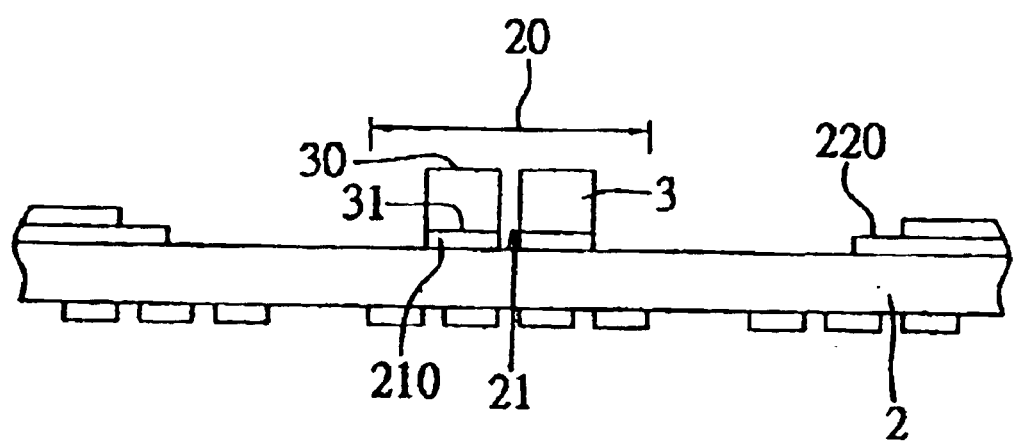

Thereafter, referring to FIG. 4B, the plurality of passive devices 3 (such as capacitors, resistors or inductors), each having a top surface 30 and a bottom surface 31, have the bottom surfaces 31 thereof attached to the solder pads 210 on the device-mounting region 21 of the substrate 2 through a solder paste (such as tin paste) with the use of surface-mount technology (SMT), so as to electrically connect the passive devices 3 to the substrate 2.

Figure 4C:
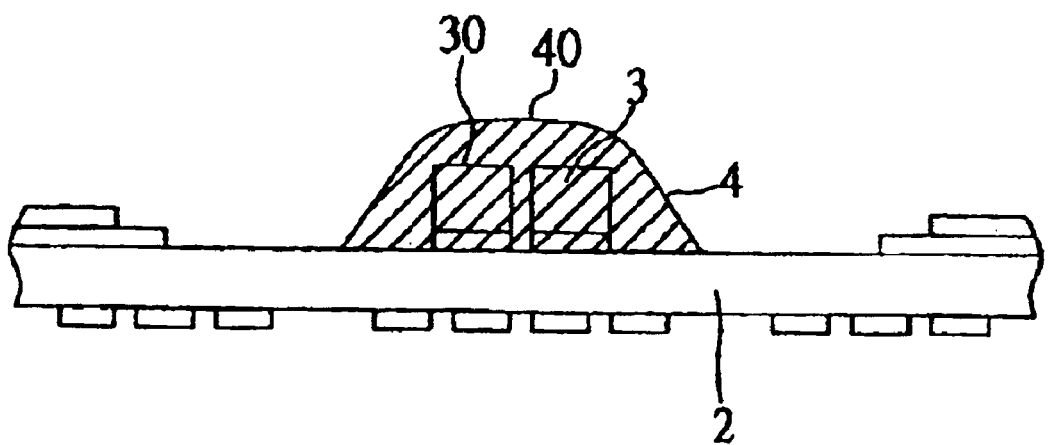

Then, referring to FIG. 4C, an insulative material 4 is used to completely encapsulate the passive devices 3 (including the periphery and the top surfaces 30 thereof) and part of the substrate 2 through a dispensing process. The insulative material is a thermosetting or thermoplastic material such as epoxy, silicone, polyimide, etc. After the dispensing process is completed, a baking process is performed to cure the insulative material 4.

As a result, prior to a molding process, the passive devices 3 are completely encapsulated by the insulative material 4 having curability and fluidity, so as to prevent the dislocation of the passive devices 3 caused by a high temperature and mold flow of a molding resin from occurring in subsequent process such as reflow or molding, and thus the occurrence of short circuit can also be avoided.

Figure 4D:
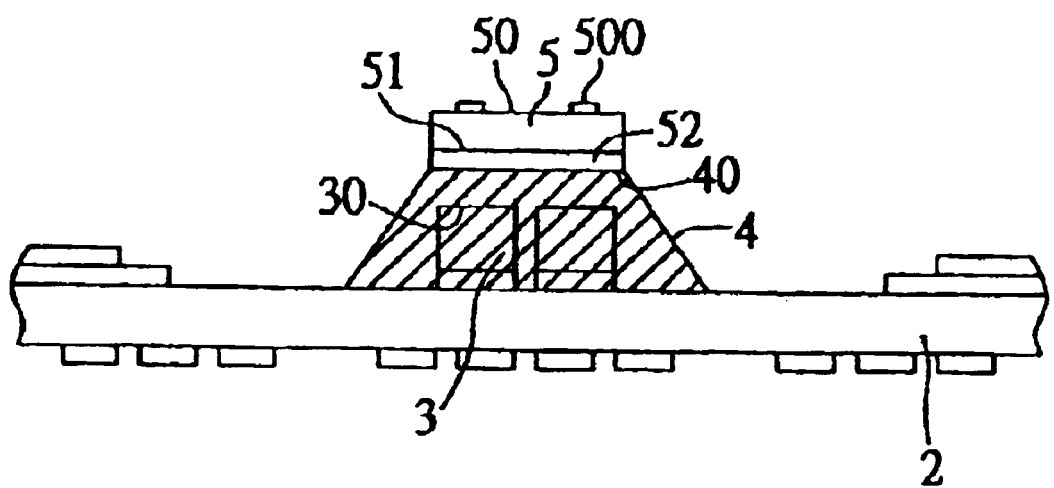

Referring further to FIG. 4D, after the insulative material 4 is cured, on the insulative material 4 above the top surfaces 30 of the passive devices 3 there is formed a surface 40 for attaching the semiconductor chip 5 thereon. The semiconductor chip 5 has an active surface 50 for forming a plurality of electrical circuits and bonding pads 500 thereon, and an inactive surface 51 firmly attached to the surface 40 of the insulative material 4 through an adhesive 52 such as a silver paste or polyimide tape. However, the attachment of the semiconductor chip 5 can also be achieved without using the adhesive 52. Alternatively, after the dispensing process is completed, the inactive surface 51 of the semiconductor chip 5 can be directly placed on the surface 40 of the insulative material 4, and then the attachment between the surfaces 51, 40 can be accomplished through performing the baking and curing processes.

Figure 4E:
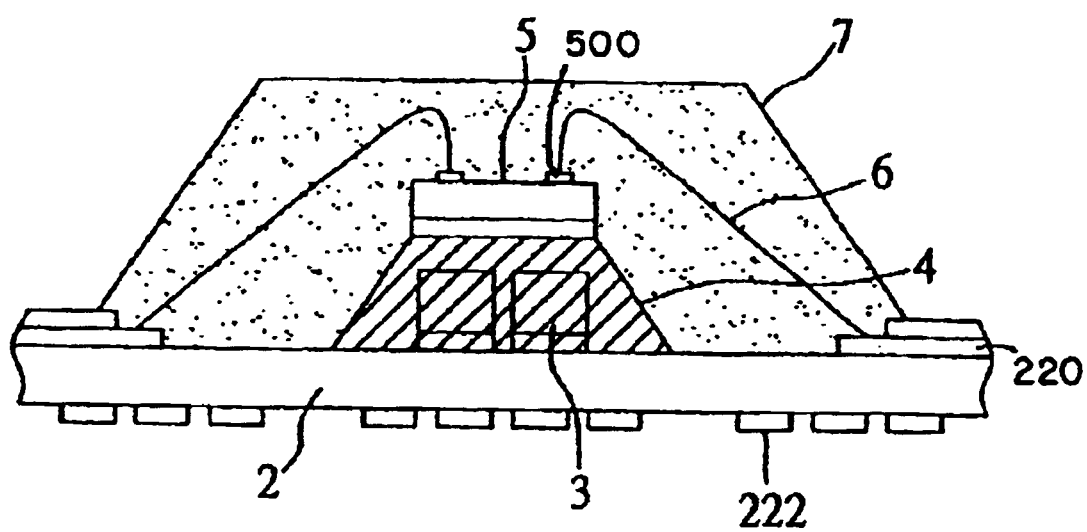

Referring further to FIG. 4E, a plurality of gold wires 6 are used to connect the bonding pads 500 of the semiconductor chip 5 to the bonding fingers 220 of the substrate 2 for electrically connecting the semiconductor chip 5 to the substrate 2. Furthermore, an encapsulant 7 is formed for encapsulating the gold wires 6, the semiconductor chip 5, part of the insulative material 4 and part of the substrate 2. Finally, with the use of conventional implanting technology, a plurality of solder balls 8 are implanted on a plurality of solder pads 222 at a bottom of the substrate 2 for electrically connecting the substrate 2 to an external device as illustrated in FIG. 3, so that the fabricating method of the semiconductor package of the invention is completed.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A fabricating method of a semiconductor package, comprising the steps of:

providing a substrate having a device-mounting region on a surface of the substrate, and a wire bonding region predefined around the device-mounting region for forming a plurality of bonding fingers thereon;

mounting a plurality of passive devices on the device-mounting region;

using an insulative material for encapsulating the passive devices;

disposing a semiconductor chip on a surface of the insulative material above the passive devices, such that the semiconductor chip is free of contact with the passive devices and the substrate;

providing a plurality of bonding wires for electrically connecting the semiconductor chip to the bonding fingers of the substrate;

forming an encapsulant for encapsulating the semiconductor chip and the bonding wires; and providing a plurality of conductive members for electrically connecting the substrate to an external device.

2. The fabricating method of claim 1, wherein the device-mounting region is formed with a plurality of solder pads for attaching the passive devices thereto.

3. The fabricating method of claim 1, wherein the passive devices each has a top surface and a bottom surface.

4. The fabricating method of claim 3, wherein the insulative material completely encapsulates the to surfaces and peripheries of the passive devices through a dispensing process.

5. The fabricating method of claim 1, wherein the insulative material is an insulative adhesive having curability and fluidity.

6. The fabricating method of claim 1, wherein the insulative material is a thermosetting or thermoplastic material selected from the group consisting of epoxy, silicone and polyimide.

7. The fabricating method of claim 1, wherein the semiconductor chip has an active surface and an inactive surface.

8. The fabricating method of claim 7, wherein the inactive surface of the semiconductor chip is directly attached to the surface of the insulative material above the passive devices before the insulative material is cured.

9. The fabricating method of claim 7, wherein the inactive surface of the semiconductor chip is attach to the surface of the insulative material above the passive devices through an adhesive after the insulative material is cured.

10. The fabricating method of claim 1, wherein the conductive members are solder bumps including solder balls.

11. A semiconductor package, comprising:
- a substrate having a device-mounting region predefined on a surface of the substrate, and a wire bonding region predefined around the device-mounting region for forming a plurality of bonding fingers thereon;
- a plurality of passive devices attached to the device-mounting region;
- an insulative material for encapsulating the passive devices;
- a semiconductor chip disposed on a surface of the insulative material above the passive devices, such that the semiconductor chip is free of contact with the passive devices and the substrate;
- a plurality of bonding wires for electrically connecting the semiconductor chip to the bonding fingers of the substrate;
- an encapsulant for encapsulating the semiconductor chip and the bonding wires; and
- a plurality of conductive members for electrically connecting the substrate to an external device.

12. The semiconductor package of claim 11, wherein the device-mounting region is formed with a plurality of solder pads for attaching the passive devices thereto.

13. The semiconductor package of claim 11, wherein the passive devices each has a top surface and a bottom surface.

14. The semiconductor package of claim 13, wherein the insulative material completely encapsulates the top surfaces and peripheries of the passive devices through a dispensing process.

15. The semiconductor package of claim 11, wherein the insulative material is an insulative adhesive having curability and fluidity.

16. The semiconductor package of claim 11, wherein the insulative material is a thermosetting or thermoplastic material selected from the group consisting of epoxy, silicone and polyimide.

17. The semiconductor package of claim 11, wherein the semiconductor chip has an active surface and an inactive surface.

18. The semiconductor package of claim 17, wherein the inactive surface of the semiconductor chip is directly attached to the surface of the insulative material above the passive devices before the insulative material is cured.

19. The semiconductor package of claim 17, wherein the inactive surface of the semiconductor chip is attached to the surface of the insulative material above the passive devices through an adhesive after the insulative material is cured.

20. The semiconductor package of claim 11, wherein the conductive members are solder bumps including solder balls.

* * * * *

UNITED STATES PATENT AND TRADEMARK OFFICE
CERTIFICATE OF CORRECTION

PATENT NO. : 6,781,222 B2
DATED : August 24, 2004
INVENTOR(S) : Chi-Chuan Wu et al.

It is certified that error appears in the above-identified patent and that said Letters Patent is hereby corrected as shown below:

<u>Title page,</u>
Item [75], Inventor, "Chian ping Huang" should read -- Chien-Ping Huang --.

Signed and Sealed this

First Day of November, 2005

JON W. DUDAS
*Director of the United States Patent and Trademark Office*